United States Patent

Shen

[19]

[11] Patent Number: 5,966,624
[45] Date of Patent: Oct. 12, 1999

[54] METHOD OF MANUFACTURING A SEMICONDUCTOR STRUCTURE HAVING A CRYSTALLINE LAYER

[75] Inventor: Hua Shen, Beacon, N.Y.

[73] Assignee: Siemens Aktiengesellschaft, Munich, Germany

[21] Appl. No.: 08/901,986

[22] Filed: Jul. 29, 1997

[51] Int. Cl.$^6$ .................................................. H01L 21/20
[52] U.S. Cl. .................... 438/478; 438/287; 438/261; 438/775
[58] Field of Search ...................... 438/479, 287, 438/261, 591, 765, 791, 775, 792, 788

[56] References Cited

U.S. PATENT DOCUMENTS

| | | | |
|---|---|---|---|
| 4,219,925 | 9/1980 | Heeren | 29/578 |
| 4,395,438 | 7/1983 | Chiang | 427/94 |
| 4,692,344 | 9/1987 | Kaganowicz et al. | 427/39 |
| 4,849,259 | 7/1989 | Biro et al. | 427/248.1 |
| 5,234,869 | 8/1993 | Mikata et al. | 437/241 |
| 5,254,369 | 10/1993 | Arai et al. | 427/248.1 |
| 5,352,487 | 10/1994 | Klinedinst et al. | 427/248.1 |
| 5,356,825 | 10/1994 | Hozumi et al. | 437/60 |
| 5,376,593 | 12/1994 | Sandhu et al. | 437/242 |
| 5,428,244 | 6/1995 | Segawa et al. | 257/646 |
| 5,460,992 | 10/1995 | Hasegawa | 438/261 |
| 5,464,792 | 11/1995 | Tseng et al. | 438/591 |
| 5,504,021 | 4/1996 | Hong et al. | 437/42 |
| 5,512,518 | 4/1996 | Cho et al. | 437/235 |
| 5,882,978 | 3/1999 | Srinivasan et al. | 438/396 |

*Primary Examiner*—Tuan H. Nguyen
*Attorney, Agent, or Firm*—Donald B. Paschburg

[57] ABSTRACT

A structure for semiconductors having a crystalline layer includes a first silicon-containing dielectric film formed on a semiconductor substrate. A crystalline layer is formed on the first dielectric film by hydrogen annealing the surface of the first dielectric layer to form a layer of silicon atoms. The silicon atoms are reacted with a gas containing nitrogen or annealed in the presence of an inert gas to form either a crystalline layer of silicon nitride or a crystalline layer of silicon, respectively. A second dielectric film can be formed on the crystalline layer. In particularly useful embodiments, the crystalline layer of silicon or silicon nitride is three to twenty monolayers. The silicon nitride structure described herein forms an improved dielectric structure reducing the thickness of dielectric layer and improving resistance to electrical breakdown. The silicon structure described herein forms a semiconductor layer on a dielectric layer.

12 Claims, 1 Drawing Sheet ized. The expansion of the memory capacity is dependent on the ability to fabricate smaller cells having increased capacities. As such, the thinner a dielectric layer can be manufactured having an equivalent or increased dielectric constant, the smaller the cell. Smaller cells allow an increased density, thereby increasing chip capacity.

METHOD OF MANUFACTURING A SEMICONDUCTOR STRUCTURE HAVING A CRYSTALLINE LAYER

BACKGROUND OF THE INVENTION

1. Field of the Invention

This disclosure relates to semiconductor devices that include a crystalline layer of silicon or silicon nitride formed between dielectric layers and methods of forming such devices.

2. Description of Related Art

Thin deposited dielectric films are often used to isolate conductors and semiconductors in many different applications. These dielectric films are subjected to breakdown due to diffusion, electromigration or other phenomena. A need exists to create an improved dielectric barrier between conductors or layers in semiconductor components, such as integrated circuits.

Application of high electric fields across insulating films can sometimes lead to local destruction of the material, a phenomenon known as dielectric breakdown. Dielectric materials such as silicon oxides are widely used in the manufacture of semiconductor devices. These materials find use not only as final passivation coatings for completed devices but also as intermediate insulating layers for multilayer devices.

The continuing trend of scaling down integrated circuits has forced the semiconductor industry to adopt new and improved techniques for fabricating precise dielectric components. One area of concern relates to dielectric layers in the creation of cell capacitors. The expansion of the memory capacity is dependent on the ability to fabricate smaller cells having increased capacities. As such, the thinner a dielectric layer can be manufactured having an equivalent or increased dielectric constant, the smaller the cell. Smaller cells allow an increased density, thereby increasing chip capacity.

Recent improvements in the creation of dielectric films has resulted in higher deposition rates, improved thickness uniformity, better step coverage, lower particle density and fewer pinhole defects which can cause catastrophic failures in semiconductor devices. However, the need to further reduce chip size and improve reliability still exists.

Silicon dioxide is known to have a high defect density especially in thinner dielectric films. Silicon dioxide also exhibits poor characteristics as a diffusion barrier against impurities. Further, silicon dioxide has a relatively low dielectric constant.

In light of silicon dioxide's limitations for dielectric layers, several alternatives have been developed. One such alternative is the use of silicon nitride ($Si_3N_4$) as a dielectric layer. This layer can be formed on a substrate's surface through a process which includes Rapid Thermal Nitridation (RTN). Under RTN, the silicon substrate is exposed to either pure ammonia ($NH_3$) or an ammonia plasma at temperatures approximately between 850 degrees C and 1200 degrees C to form a silicon nitride film.

Dielectric layers fabricated employing RTN, however, have several shortcomings. Conventional RTN-type dielectrics sometimes lack uniformity in their overall composition. Further, conventional RTN-type dielectrics may have questionable reliability in part because of their susceptibility to high electrical leakage, as well as electrical and thermal breakdown. Hence the overall cell capacitance is limited. Therefore, a need exists for an improved dielectric layer less susceptible to current leakage and dielectric breakdown failures. A need also exists for reducing the thickness of the dielectric layer for capacitors. This would result in smaller memory chips, for example.

In addition to seeking out improved dielectric layers, the semiconductor industry has sought out techniques for forming a semiconductor layer on top of a dielectric layer. There are advantages in having this capability. One example is the widespread interest for thin film transistor devices. If possible, an additional layer of transistors could be placed on a chip, providing a more efficient use of space.

SUMMARY OF THE INVENTION

A dielectric structure for semiconductors having a crystalline layer includes a first silicon-containing dielectric film formed on a semiconductor substrate. A crystalline layer is formed on the first dielectric film by hydrogen annealing the surface of the first dielectric layer to form a layer of silicon atoms. The silicon atoms are reacted with a gas containing nitrogen or annealed in the presence of an inert gas to form either a crystalline layer of silicon nitride or a crystalline layer of silicon, respectively. A second dielectric film can be formed on the crystalline layer. In particularly useful embodiments, the crystalline layer of silicon or silicon nitride is three to twenty monolayers. The silicon nitride structure described herein forms an improved dielectric structure reducing the thickness of dielectric layer and improving resistance to electrical breakdown. The silicon structure described herein forms a semiconductor layer on a dielectric layer.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

This disclosure relates to semiconductor devices having a crystalline layer produced in situ from material derived from an existing dielectric layer. A first embodiment includes a substrate with a layer of silicon dioxide wherein the silicon dioxide layer is processed to form a pure silicon layer. The silicon layer is then reacted to form a silicon nitride crystalline layer, preferably of several monolayers in thickness. A layer of dielectric (e.g., amorphous silicon nitride) can then be deposited on the crystalline layer to create an improved dielectric structure. In a second embodiment, the pure silicon layer is annealed to form a crystalline layer, preferably of several monolayers in thickness. A layer of dielectric (e.g., amorphous silicon nitride) can then be deposited on the crystalline layer to form a semiconductor between two dielectric layers.

Figure 1:
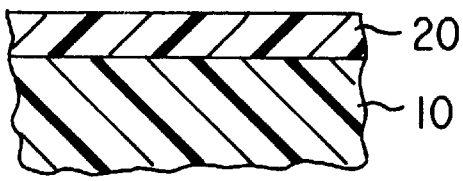
FIG. 1 shows a semiconductor substrate, having a layer of silicon dioxide formed thereon, within a chamber (not shown)

Referring to FIG. 1, a semiconductor substrate 10, has silicon containing dielectric layer 20 formed thereon. Substrate 10 preferably comprises polycrystalline or a single crystal silicon though any other suitable material known in the art can be used. The substrate 10 should be atomically clean before application of silicon containing dielectric layer 20. Dielectric layer 20 can be formed from any silicon containing dielectric material such as, for example, silicon dioxide and be formed using plasma enhanced chemical vapor deposition or other methods known in the art.

Figure 2:
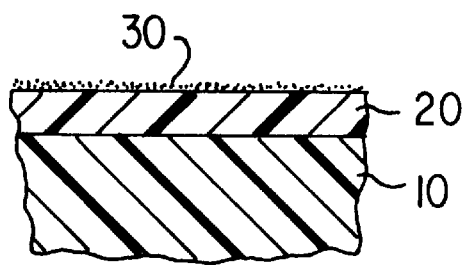
FIG. 2 shows a layer of silicon formed on the silicon dioxide dielectric layer.

The silicon dioxide layer 20 is annealed in the presence of hydrogen gas. During this hydrogen annealing step, it is believed that the hydrogen gas reacts with the oxygen in the silicon dioxide leaving behind a layer 30 of relatively pure silicon as seen in FIG. 2.

Hydrogen gas is contacted with layer 20 within an enclosed vessel or chamber (not shown). The pressure of hydrogen gas within the chamber is normally in the range of about 1 torr to about 9 torr. The hydrogen gas is substantially pure. The reaction of hydrogen gas with layer 20 is conducted at a temperature in the range of from about 850° C. to about 1000° C., preferably about 950° C. for a period of time ranging from about 20 minutes to about 30 minutes. To prevent build up of reaction by products (e.g., $H_2O$), hydrogen gas is caused to flow through the reaction vessel. Flow rates of about 1000 sccm to about 5000 sccm can be used.

The thickness of this silicon layer 30 formed depends on a number of factors including the duration of and temperature at which the hydrogen anneal is performed. The thickness of the silicon layer 30 formed can be in the range of from about 5 Angstroms to about 20 Angstroms at the surface of layer 20.

Figure 3:
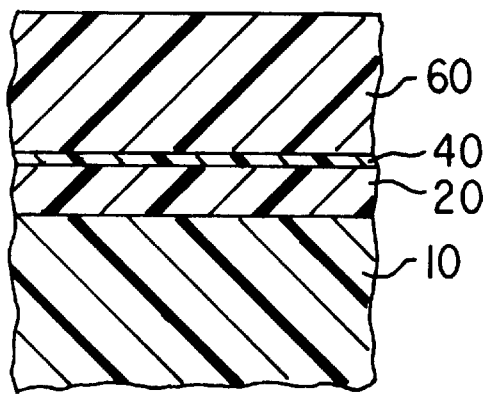
FIG. 3 shows a first preferred embodiment of the invention.

In a preferred embodiment shown in FIG. 3 silicon layer 30 is exposed to a nitrogen-based gas to form a crystalline layer of silicon nitride. RTN can be used to react the available silicon atoms on top of the dielectric layer with nitrogen. As previously mentioned, in the RTN process ammonia ($NH_3$) or pure nitrogen is reacted with the surface. The nitrogen reacts with silicon forming silicon nitride ($Si_3N_4$). The RTN process is conducted at temperatures in the range of about 850° C. to about 1000° C. at pressures of from about 1 torr to about 9 torr, for a period of time ranging from about 20 minutes to about 30 minutes. In a particularly useful embodiment, the surface can be controlled to react only long enough to form 3 to 20 monolayers of crystalline silicon nitride 40. This conserves thickness and results in smaller capacitors. The layer of crystalline silicon nitride possesses a relatively higher dielectric constant than amorphous silicon nitride or silicon dioxide.

In order to protect the crystalline silicon nitride layer 40 and to provide a better dielectric, a layer 60 of a dielectric material such as, for example, an amorphous silicon nitride layer can be grown thereon. The amorphous silicon nitride layer 60 can be formed using LPCVD or other methods known in the art. The crystalline silicon nitride layer 40 provides improved dielectric characteristics for the entire dielectric structure, and reduces leakage current. Use of a crystalline silicon nitride layer in a capacitor dielectric layer can increase the dielectric constant by 15%, for example, and reduce current leakage by 50%, for example. Where the crystalline layer is approximately several monolayers thick, a reduction in capacitor size is advantageously accomplished, satisfying the continuing trend of scaling down integrated circuits. Dielectric layers are the foundation to the creation of cell capacitors. The expansion of the memory capacity is dependent on the ability to fabricate smaller cells having increased capacities. As such, the thinner a dielectric layer can be manufactured having an equivalent or increased dielectric constant, the smaller the cell.

Figure 4:
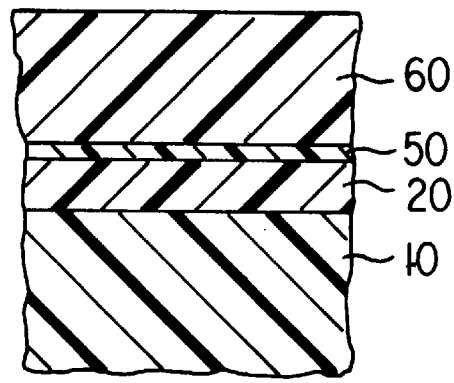
FIG. 4 shows a second preferred embodiment of the invention.

In an alternative embodiment, layer 30 of silicon atoms produced by the hydrogen anneal process as mentioned above and shown in FIG. 2, can be annealed in the presence of an inert gas to form a crystalline silicon layer 50 as seen in FIG. 4. Any inert gas or combination of inert gases can be employed in this annealing step. Preferred inert gases include He, Ar or a combination thereof. The inert gas annealing process is conducted at temperatures in the range of about 800° C. about 1200° C. at pressures of from about 1 torr to about 50 torr. In a particularly useful embodiment, conditions are selected to convert the pure silicon atoms into a silicon crystal a few monolayers thick. A preferred thickness range is from between 3 to 20 monolayers thick.

In order to protect the crystalline silicon layer 50, a layer 60 of a dielectric material such as, for example, an amorphous layer of silicon nitride can be grown thereon. Layer 60 can be formed using LPCVD or other methods known in the art.

The silicon layer 50 provides a layer of semiconductor material between two dielectric layers. There may be other advantages to having a semiconductor material between two dielectric layers. For example, it is contemplated that the silicon can be doped using known techniques or to form thin film transistors or other devices on the crystalline silicon layer.

Having described preferred embodiments of a method for forming a crystalline layer (which are intended to be illustrative and not limiting), it is noted that the modifications and variations could be made by those skilled in the art in light of the above teachings. It is therefore to be understood that changes may be made in the particular embodiments of the invention disclosed which are within the scope and spirit of the invention defined by the appended claims.

What is claimed is:

1. A method of manufacturing a semiconductor device, comprising the steps of:

providing a semiconductor substrate forming a first dielectric layer containing silicon on the semiconductor substrate;

forming a surface layer of silicon from the first dielectric layer; and annealing the layer of silicon to form a crystalline layer on the first dielectric layer.

2. The method of claim 1 wherein the step of forming a first dielectric layer containing silicon on said semiconductor substrate comprises forming a first layer of silicon dioxide on said semiconductor substrate.

3. The method of claim 1 wherein the step of forming a surface layer of silicon, comprises exposing the first dielectric layer to hydrogen gas.

4. The method of claim 1 wherein the step of annealing the layer of silicon produces a crystalline layer of silicon three to twenty monolayers thick on the first dielectric layer.

5. The method of claim 1 further comprising the step of doping the crystalline layer.

6. The method of claim 1 further comprising the step of forming a second dielectric layer on the crystalline layer.

7. A method of manufacturing a semiconductor device, comprising the steps of:

providing a semiconductor substrate forming a first dielectric layer containing silicon on the semiconductor substrate;

forming a surface layer of silicon from the first dielectric layer;

contacting the surface layer of silicon with a nitrogen containing gas to form a layer of silicon nitride;

annealing the layer of silicon nitride to form a crystalline layer on the first dielectric layer; and forming a second dielectric layer on the crystalline layer.

8. The method of claim 7 wherein the step of forming a first dielectric layer containing silicon on said semiconductor substrate comprises forming a layer of silicon dioxide on the semiconductor substrate.

9. The method of claim 7 wherein the step of forming a surface layer of silicon, comprises exposing the first dielectric layer to hydrogen gas.

10. The method of claim 7 wherein the step of contacting the surface layer of silicon with a nitrogen containing gas comprises contacting the surface layer of silicon with $N_2$ or $NH_3$ gas.

11. The method of claim 7 wherein the step of annealing the layer of silicon nitride produces a crystalline layer of silicon nitride three to twenty monolayers thick on the first dielectric layer.

12. A method of manufacturing a semiconductor device, comprising the steps of:

providing a semiconductor substrate forming a first dielectric layer of silicon dioxide on the semiconductor substrate;

exposing the first dielectric layer to hydrogen gas to form a surface layer of pure silicon;

reacting the surface layer of silicon with ammonia at elevated temperature to form a crystalline layer of silicon nitride on the first dielectric layer; and forming a second dielectric layer consisting of silicon nitride on the crystalline layer.

* * * * *